(12) United States Patent
Elashri et al.

(10) Patent No.: US 12,222,776 B1
(45) Date of Patent: Feb. 11, 2025

(54) HEAT SINKS FOR BARE DIE MULTI-CHIP PACKAGES

(71) Applicant: Amazon Technologies, Inc., Seattle, WA (US)

(72) Inventors: Ali Elashri, Seattle, WA (US); William Mark Megarity, Renton, WA (US); Ryan F Conroy, Seattle, WA (US); Chetan Sanjay Agarwal, Seattle, WA (US); Priti Choudhary, Sunnyvale, CA (US)

(73) Assignee: Amazon Technologies, Inc., Seattle, WA (US)

( * ) Notice: Subject to any disclaimer, the term of this patent is extended or adjusted under 35 U.S.C. 154(b) by 390 days.

(21) Appl. No.: 17/547,919

(22) Filed: Dec. 10, 2021

(51) Int. Cl.
G06F 1/18 (2006.01)
G06F 1/20 (2006.01)
H05K 7/20 (2006.01)

(52) U.S. Cl.
CPC .............. G06F 1/183 (2013.01); G06F 1/20 (2013.01); H05K 7/20254 (2013.01); *G06F 2200/201* (2013.01)

(58) Field of Classification Search
CPC ...... G06F 1/183; G06F 1/20; G06F 2200/201; H05K 7/20254
See application file for complete search history.

(56) References Cited

U.S. PATENT DOCUMENTS

| | | | |
|---|---|---|---|
| 6,282,093 B1 * | 8/2001 | Goodwin | H01L 23/4006 361/720 |
| 6,593,673 B1 * | 7/2003 | Sugai | G06F 1/206 361/695 |
| 7,289,335 B2 * | 10/2007 | Callahan | H05K 7/1061 361/803 |
| 7,423,882 B1 * | 9/2008 | Tong | H01L 23/4093 174/16.3 |
| 7,619,895 B1 * | 11/2009 | Wertz | H01L 23/427 361/719 |
| 7,643,299 B2 * | 1/2010 | Lai | H01L 23/4093 174/16.3 |
| 8,724,326 B2 * | 5/2014 | Yang | H01L 23/4093 174/16.3 |
| 8,944,149 B2 * | 2/2015 | Zhou | H01L 23/4006 248/220.21 |
| 11,191,187 B2 * | 11/2021 | Schmit | H05K 1/0203 |
| 2003/0121643 A1 * | 7/2003 | Connors | H01L 23/3675 257/E23.103 |

(Continued)

OTHER PUBLICATIONS

U.S. Appl. No. 17/206,023, dated Mar. 18, 2021, Luke Thomas Gregory.

(Continued)

*Primary Examiner* — Stephen S Sul

(74) *Attorney, Agent, or Firm* — Alexander A. Knapp; Kowert, Hood, Munyon, Rankin & Goetzel, P.C.

(57) ABSTRACT

Various mounting systems for mounting heat sink apparatus to bare die processors are disclosed. The mounting systems include an upper plate, which may include a heat transfer portion, positioned in proximity to the upper surface of bare die processors to provide heat conduction away from the processors. The disclosed mounting systems secure the upper plate to the processors with balanced and centralized forces to inhibit tilting of the upper plate and reduce the risk of damaging the processors.

13 Claims, 13 Drawing Sheets

(56) References Cited

U.S. PATENT DOCUMENTS

| | | | |
|---|---|---|---|
| 2004/0012927 A1* | 1/2004 | Lee | H01L 23/4093 257/719 |
| 2004/0017662 A1* | 1/2004 | Liu | H01L 23/4093 24/457 |
| 2005/0022973 A1* | 2/2005 | Lee | H01L 23/4093 165/80.3 |
| 2005/0128710 A1* | 6/2005 | Beitelmal | H05K 7/20445 361/709 |
| 2005/0152119 A1* | 7/2005 | Lee | H01L 23/4093 361/710 |
| 2005/0195572 A1* | 9/2005 | Franz | H01L 23/4093 361/679.48 |
| 2008/0094802 A1* | 4/2008 | Kumagai | G06F 1/203 361/709 |
| 2010/0181665 A1* | 7/2010 | Casey | H01L 23/433 257/723 |
| 2011/0075360 A1* | 3/2011 | Tomioka | H05K 7/20336 361/695 |
| 2012/0184129 A1* | 7/2012 | Wertz | H01R 12/73 439/485 |
| 2015/0000868 A1* | 1/2015 | Sri-Jayantha | B23P 15/26 165/76 |
| 2016/0212881 A1* | 7/2016 | Saito | H05K 7/20727 |
| 2020/0120790 A1* | 4/2020 | Wu | H01L 23/445 |
| 2021/0274640 A1* | 9/2021 | Chen | H05K 7/20509 |

OTHER PUBLICATIONS

Intel, "How to Know if the Heatsink is Compatible with the Intel Processor", Retrieved from https://www.intel.com/content/www/us/en/support/articles/000030760/processors/intel-core-processors.html on Mar. 18, 2021, pp. 1-2.

NVIDIA, "NVIDIA GPU maximum operating temperature and overheating", Retrieved from https://nvidia.custhelp/app/answers/detail/a_id/2752/related/1 on Mar. 18, 2021, pp. 1-2.

NVIDIA, "Why does my graphics card run hot?", Retrieved from https://nvidia.custhelp/com/app/answers/detail/a_id?2343 on Mar. 18, 2021, pp. 1-2.

Xilinx, "Mechanical and Thermal Design Guidelines for Lidless Flip-Chip Packages Application Note", XAPP1301 (v1.6), Feb. 23, 2021, pp. 1-88.

U.S. Appl. No. 17/179,296, filed Feb. 17, 2021, Luke Thomas Gregory, et al.

* cited by examiner

HEAT SINKS FOR BARE DIE MULTI-CHIP PACKAGES

BACKGROUND

Some computer systems include a number of components that generate waste heat. Such components may include mass storage devices, power supplies, and processors. For example, some computers with multiple processors may generate 400 watts of waste heat. Some known computer systems include a plurality of such larger, multiple-processor computer systems that are configured into rack-mounted components, and then are subsequently positioned within a rack system. Some known rack systems include 40 such rack-mounted computer systems and such rack systems will therefore generate as much as 30 kilowatts of waste heat. Moreover, some known data centers include a plurality of such rack systems.

Some computer systems, which may function as servers, include a number of components that are mounted in an interior of the computer systems. The components, which can include printed circuit boards (for example, a motherboard) and processors, generate waste heat and may be referred to herein as "heat-producing components." For example, a motherboard may support a central processing unit, a graphics processing unit, an application specific integrated circuit, or other types of processors that generate waste heat. Some or all of this waste heat must be removed from such processors to maintain continuous operation of the computer system.

Packages that support or house these processors may be designated as either a lidded package or a bare die package. A lidded package generally includes a metal "lid" such as an integrated heat spreader ("IHS"). Lidded packages are currently the most commonly used packages due to the protection provided by the lid. Bare die packages remove the lid, which substantially improves the cooling of the chip(s) by reducing the overall thermal resistance between the chips' junctions and ambient air. Removing the lid, however, does expose the fragile chip(s) to the environment and contamination. Additionally, the bare die (chip) may be subject to pressure load from a heat sink when it is installed above the bare die. The pressure load may increase the risk of damage or cracking if the load from the heat sink is not sufficiently distributed across the bare die or if contaminants get between the bare die surface and the heat sink. These risks are increased with the use of multi-chip packages (MCP) as there are multiple chips of potentially varying heights that the heat sink cools while pressure distribution has to be controlled across all the chips from a single heat sink.

Figure 1:
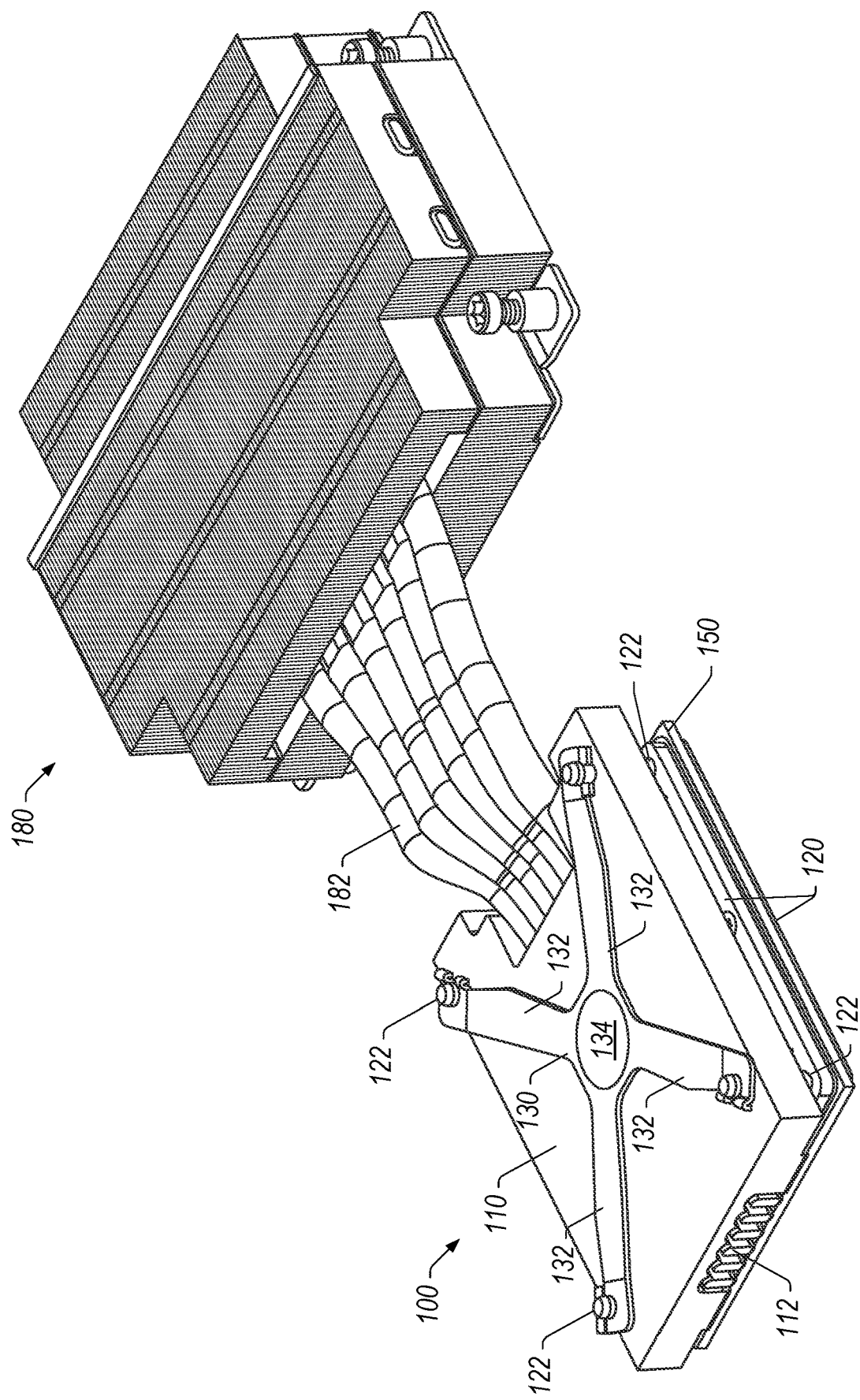
FIG. 1 depicts a top perspective view of an embodiment of a bare die processor mounting system.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Processors, such as central processing units (CPUs), graphics processing units (GPUs), application specific integrated circuits (ASICs), field programmable gate arrays (FPGAs), etc. generate a considerable amount of waste heat. In many instances, multiples of these processors are coupled to a single package in a multi-chip package (MCP) design. As these processors often have varying heights above the surface of the package substrate (e.g., the motherboard or printed circuit board), MCP package designs often include a metal lid (e.g., an integrated heat spreader (IHS). The IHS protects the processors while distributing heat to the heat sink. The IHS, however, adds thermal resistance between the processors and the heat sink. Thus, removing the IHS from the package, resulting in a bare die package design, may improve cooling of the processors. Bare die systems, however, may be more vulnerable to the environment and contaminants as well as pressure loads from the heat sink, which may damage the fragile processors.

To solve these problems with bare die MCP designs, various embodiments described herein include a heat sink designed to be coupled to an MCP package with a balanced or centralized load to avoid damaging the processors while securing the heat sink to the package. As used herein, a "heat sink" refers to any structural component that is capable of transferring heat away from another structural component (e.g., processor) coupled to the heat sink. In some embodiments, a heat sink may be referred to as a heat exchanger. For instance, a heat sink may be a heat exchanger when a fluid is passed through the heat sink to remove heat from the heat sink. Embodiments of various brackets and plates are disclosed that allow a heat sink to be secured to a package while balancing or centralizing the load on the package. Additionally, the various disclosed heat sink embodiments may allow an entire combined assembly of the heat sink and the package to be handled and removed as a single unit. Handling the heat sink and package as the single unit may prevent environmental contamination of surfaces of the package (e.g., outside the controlled environment of a clean room) and reduce the risk of damaging the processors during service of the assembly (e.g., removal for repair or replacement). In some embodiments, the heat sink may include a stepped lower surface that allows for processors of varying heights to be positioned under the heat sink.

Figure 2:
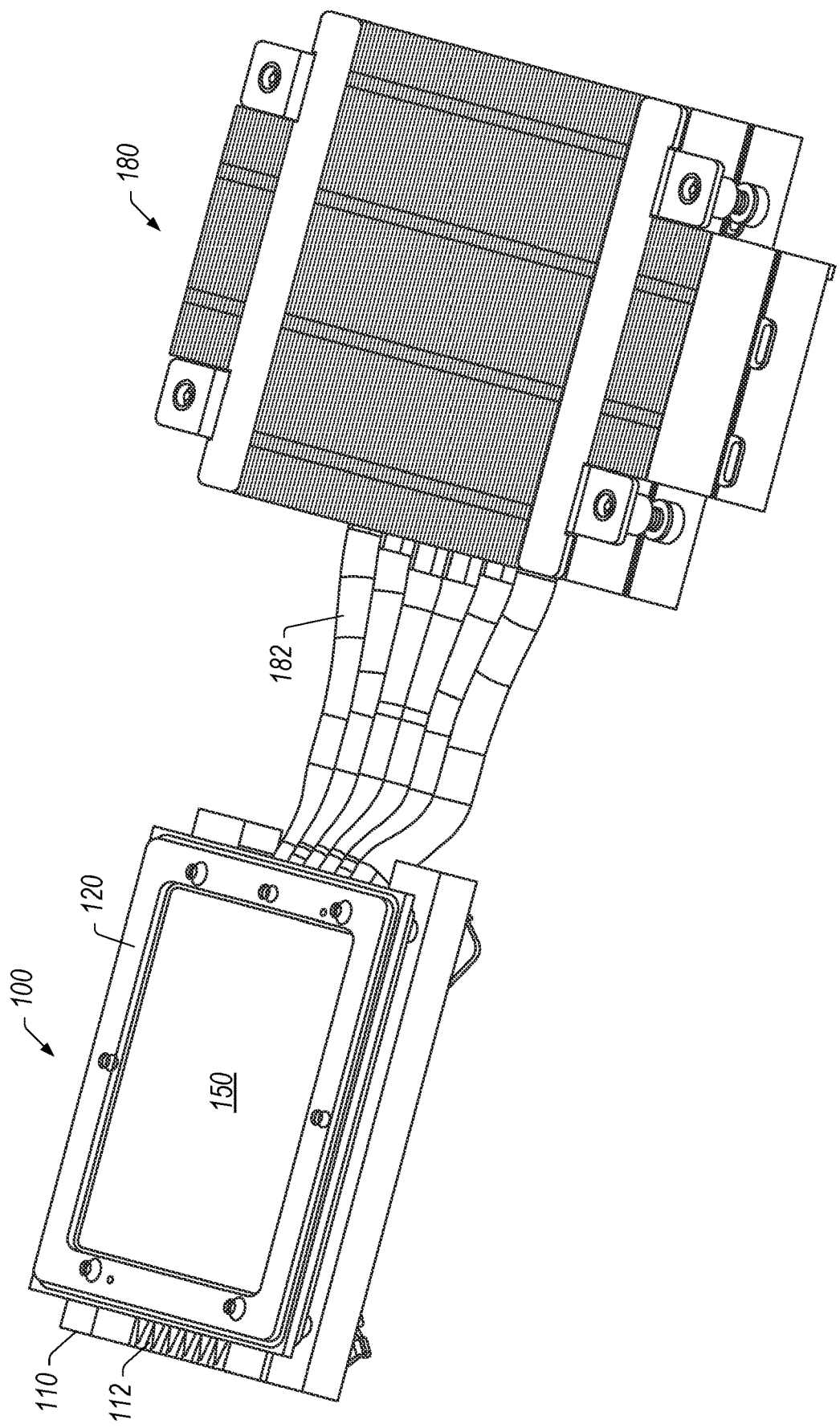
FIG. 2 depicts a bottom perspective view of the embodiment of a bare die processor mounting system.

FIG. 1 depicts a top perspective view of an embodiment of a bare die processor mounting system. FIG. 2 depicts a bottom perspective view of the embodiment of mounting system 100. In the illustrated embodiment, mounting system 100 is a mounting system for processor 150. In various embodiments, processor 150 includes multiple processors in a single package (e.g., an MCP). For example, processor 150 may be any number of processors on a motherboard or other printed circuit board. As used herein, processor 150 refers to any number of processors, which may or may not be positioned in a package. In certain embodiments, processor 150 is a bare die processor or a set of bare die processors. As used herein, a bare die processor refers to a processor (or a set of processors) that does not have a lid or integrated heat shield positioned on top of the processor(s). Additionally, while processor 150 is commonly referred to as a bare die processor herein, other embodiments may be contemplated where processor 150 is a lidded or shielded processor or a lidded or shielded set of processors.

In the illustrated embodiment, mounting system 100 includes upper plate 110 and lower plate 120 positioned on opposing sides of processor 150. In some embodiments, upper plate 110 may be, or be part of, a heat sink (e.g., a heat exchanger). For instance, in the depiction of FIG. 1, upper plate 110 (e.g., the heat sink) includes heat transfer portion 112. Heat transfer portion 112 may include passages or other conduits in fluid communication with cooling tubes 182, which are in fluid communication with cooling system 180. Accordingly, in various embodiments, upper plate 110 may remove heat from processor 150 and transfer the heat to cooling system 180 via a cooling fluid flowing through heat transfer portion 112 and cooling tubes 182.

In some embodiments, as shown in FIGS. 1 and 2, lower plate 120 includes multiple plates. For instance, processor 150 may be sandwiched between two plates that together form lower plate 120. The multiple plates may have fastening means to secure the plates or the plates may be fastened when mounting system 100 is secured in place (such as by bracket 130, as described herein).

In certain embodiments, lower plate 120 includes a plurality of posts 122 extending upwards from the lower plate (towards upper plate 110). In the illustrated embodiment, posts 122 are positioned at the corners of lower plate 120. Posts 122 may, however, be positioned at various locations along edges of lower plate 120 depending on the shape or design of the lower plate, upper plate 110, and mounting system 100. For instance, embodiments may be contemplated where lower plate 120 is circular or has rounded edges. In such embodiments, the posts are positioned along the edges but not necessarily at corners of the lower plate. Additionally, while four posts 122 are shown in FIG. 1, any number of posts may be designed for mounting system 100 as long as the posts are capable of engaging a bracket (e.g., bracket 130, described herein) to provide a centralized (e.g., balanced) force on processor 150.

Figure 3:
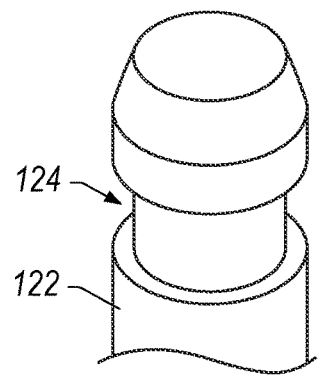
FIG. 3 depicts a representation of an embodiment of a protruding portion of a post.

In various embodiments, as shown in FIG. 1, posts 122 extend and protrude above an upper surface of upper plate 110. Accordingly, upper plate 110 may have openings or passages that allow posts 122 to pass through the upper plate when the upper plate is positioned over lower plate 120. FIG. 3 depicts a representation of an embodiment of a protruding portion of a post. In the illustrated embodiment, the protruding portion of post 122 includes notch 124. Notch 124 may provide a clearance for slots in bracket 130 (described below) to move onto post 122 and lock (e.g., secure) the bracket to the post.

Turning back to FIG. 1, mounting system 100 includes bracket 130. Bracket 130 may be used to secure mounting system 100, including upper plate 110 and lower plate 120, to processor 150. In certain embodiments, bracket 130 includes central portion 134 and legs 132. Bracket 130 includes a number of legs 132 to match the number of posts 122 protruding above the upper surface of upper plate 110. In the illustrated embodiment, bracket 130 includes four legs 132 to engage with four posts 122 protruding above the upper surface of upper plate 110.

Figure 4:
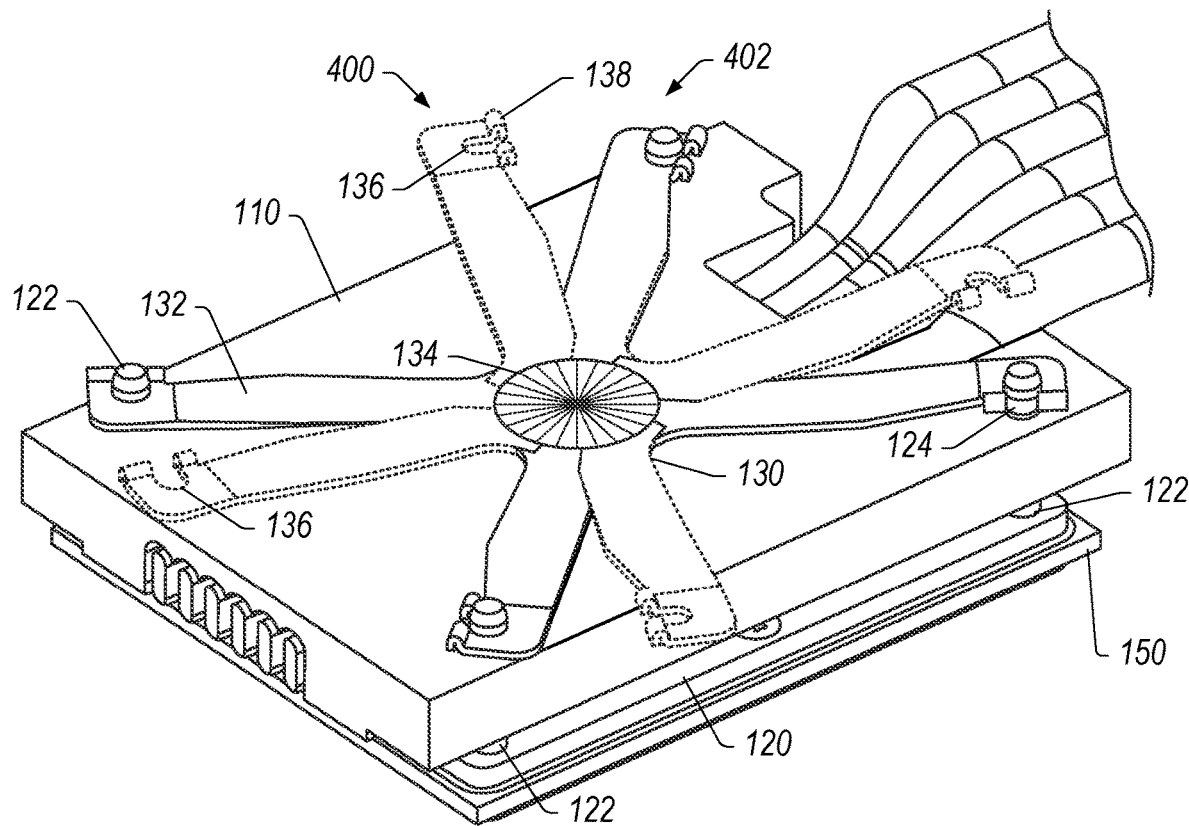
FIG. 4 depicts a perspective view of an embodiment for engagement between a bracket and posts to secure an upper plate and a lower plate to a processor.

FIG. 4 depicts a perspective view of an embodiment for engagement between bracket 130 and posts 122 to secure upper plate 110 and lower plate 120 to processor 150. In the illustrated embodiment, end portions of legs 132 include slots 136 along the sides of the legs. Slots 136 are configured to engage with notches 124 in posts 122, as shown on the right side of FIG. 4. In certain embodiments, end portions of legs 132 also include raised portions 138. Raised portions 138 may secure the end portions of legs 132 to posts 122 when slots 136 are engaged with notches 124.

In the illustrated embodiment, bracket 130 is rotatable between two positions—unlocked position 400 (dashed lines) and locked position 404 (solid lines). In unlocked position 400, bracket 130 may be positioned on upper plate 110 in preparation for securing mounting system 100 to processor 150. After positioning of bracket 130 on upper plate 110, the bracket may be rotated (clockwise in the illustrated embodiment) to locked position 404. As bracket 130 is rotated, slots 136 in legs 132 simultaneously engage notches 124 in posts 122. A small force may be provided to overcome a resistance of engagement provided by raised portions 138.

As slots 136 in legs 132 simultaneously engage notches 124, a balanced and centralized downwards force is provided by bracket 130 on upper plate 110. Once slots 136 are engaged with notches 124, upper plate 110 and lower plate 120, and thus mounting system 100, are secured to processor 150. Providing the balanced and centralized downward force while securing mounting system 100 to processor 150 inhibits unbalanced forces from being provided to the upper plate that may tilt the plate and cause cracking of the processor. Thus, mounting system 100 is safer for use with for bare die processors that do not have any lid or shielding.

Figure 5:
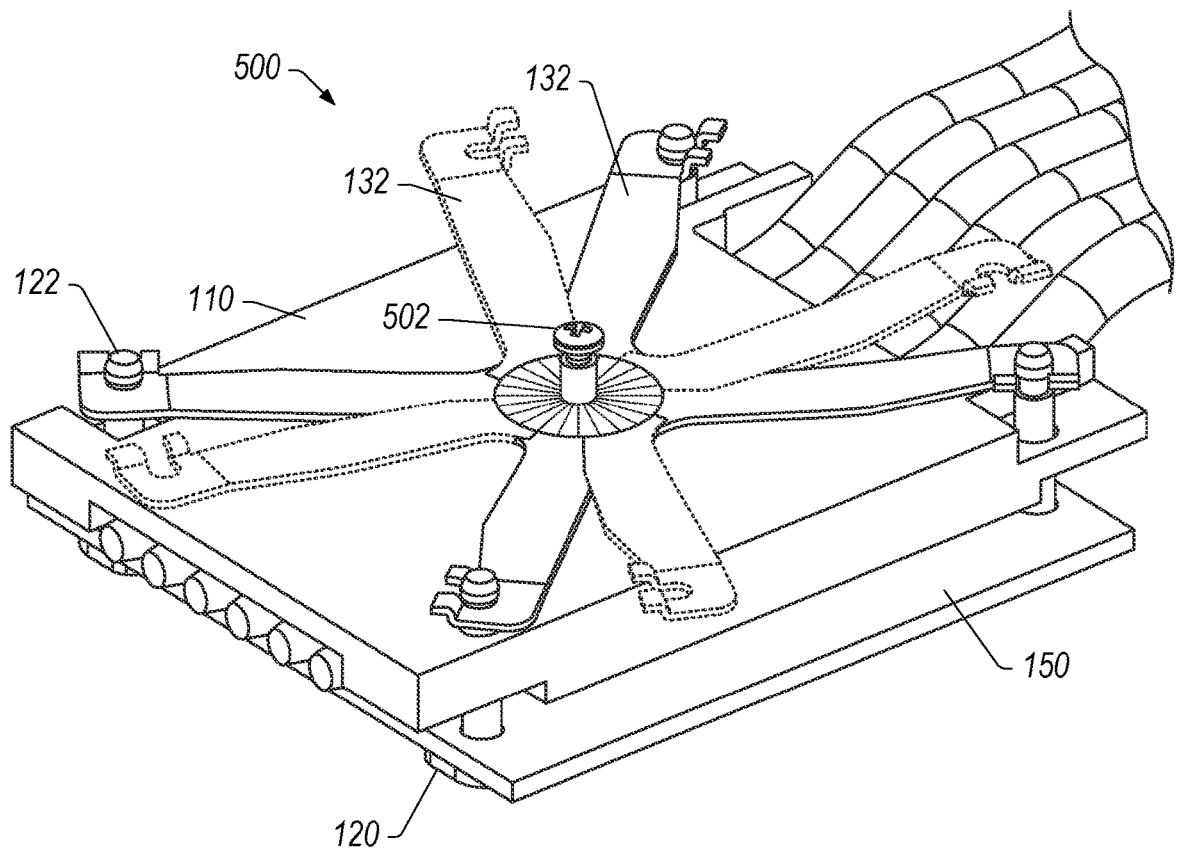
FIG. 5 depict a top perspective view representation of an embodiment of a bracket with a rotation system.
Figure 6:
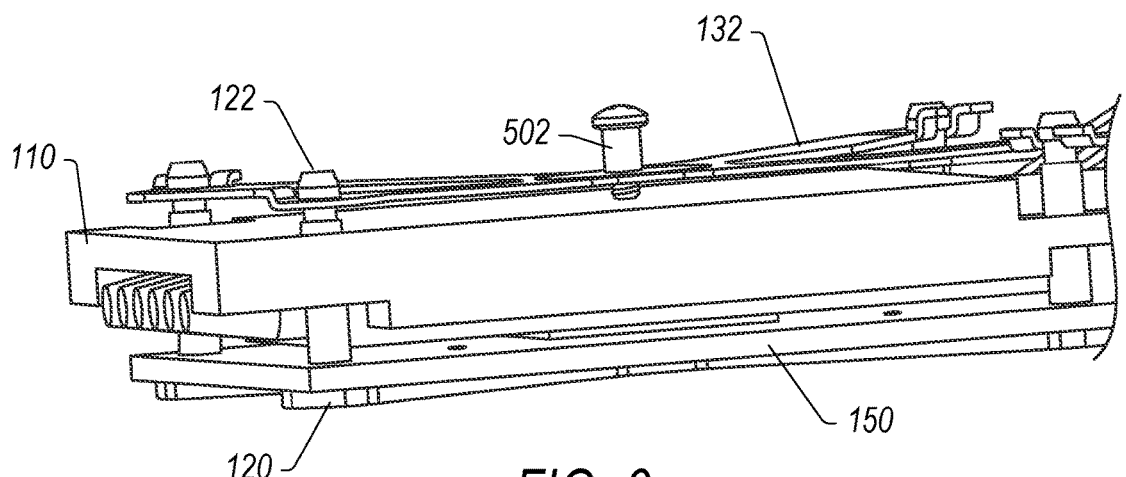
FIG. 6 depicts a side-view representation of an embodiment of a bracket with a rotation system.

In some embodiments, bracket 130 is rotated manually (e.g., by a user's hand). In other embodiments, bracket 130 may be rotated by a special tool. The special tool may be designed to provide controlled rotation of bracket 130 and inhibit unwanted irregular forces on the bracket or upper plate 110. In some embodiments, bracket 130 may include a rotation system built-in the bracket. FIGS. 5 and 6 depict a top perspective view representation and a side-view representation, respectively, of an embodiment of bracket 130 with rotation system 500. In the illustrated embodiment, rotation system 500 includes screw 502 located in central portion 134 of bracket 130. Rotation of screw 502 may rotate bracket 130 (e.g., in the clockwise rotation for engagement of legs 132 with posts 122). As screw 502 is rotated, the screw provides a small force to upper plate 110. In the installed position, as shown in FIG. 6, the force applied by screw 502 may provide a small standoff between bracket 130 and upper plate 110.

Figure 7:
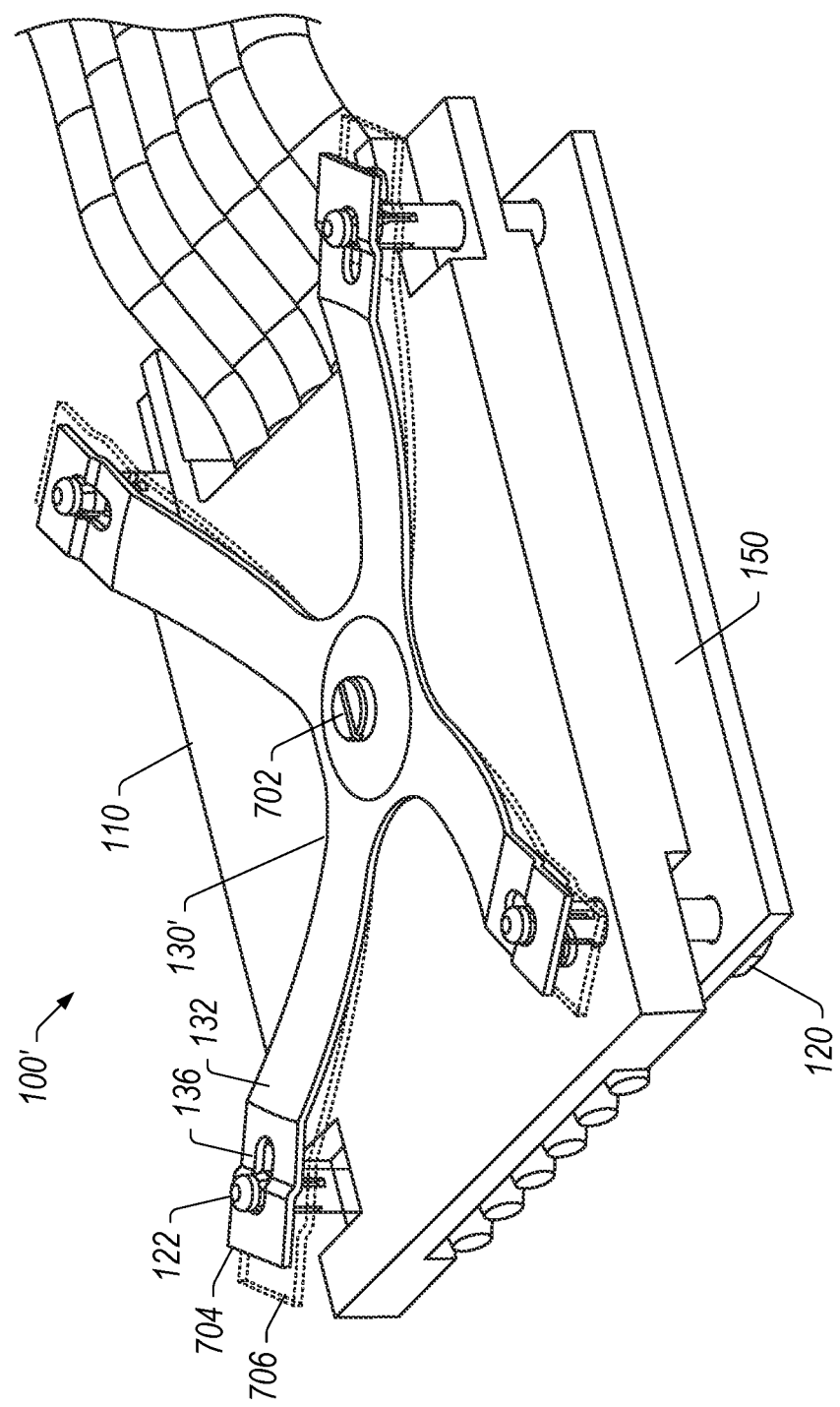
FIG. 7 depicts a top perspective view of an alternative embodiment of a mounting system.
Figure 8:
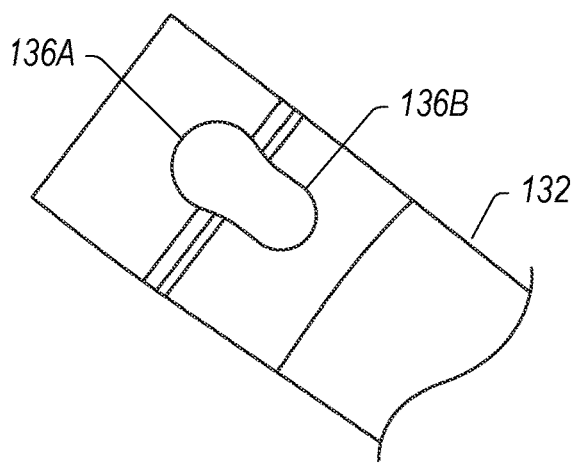
FIG. 8 depicts a top view representation of a slot.
Figure 9:
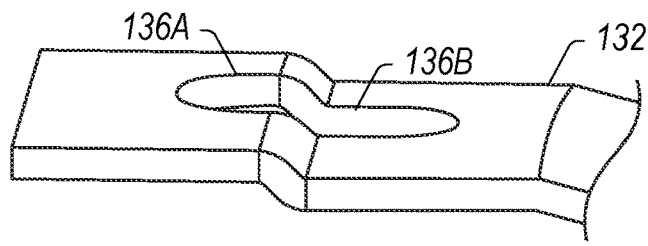
FIG. 9 depicts a side-view representation of a slot.

FIG. 7 depicts a top perspective view of an alternative embodiment of a mounting system. In the illustrated embodiment, mounting system 100' includes bracket 130'. Bracket 130' includes screw 702 that secures the bracket to upper plate 110. Bracket 130' includes slots 136 in an interior portion of end portions of legs 132. FIGS. 8 and 9 depict a top view representation and a side-view representation, respectively, of slot 136 in leg 132. In certain embodiments, as shown in FIGS. 8 and 9, slots 136 extend over a stepped portion of legs 132. Slots 136 also include first portion 136A and second portion 136B. First portion 136A allows posts 122 to be inserted into the slots while second portion 136B is a locking position for notches 124 in the posts.

Turning back to FIG. 7, to engage bracket 130' with posts 122 and secure the bracket to upper plate 110 and lower plate 120, a downward force is applied to legs 132 moving the legs from an unlocked position (position 704 (solid lines)) to a locked position (position 706 (dashed lines)). Downward force on legs 132 allows slots 136 to engage and lock into notches 124 in posts 122. In various embodiments, the downward force is applied evenly to legs 132 to avoid unbalanced force to upper plate 110 and processor 150. For example, a special tool may be designed to apply downward force equally across the four legs 132.

Figure 10:
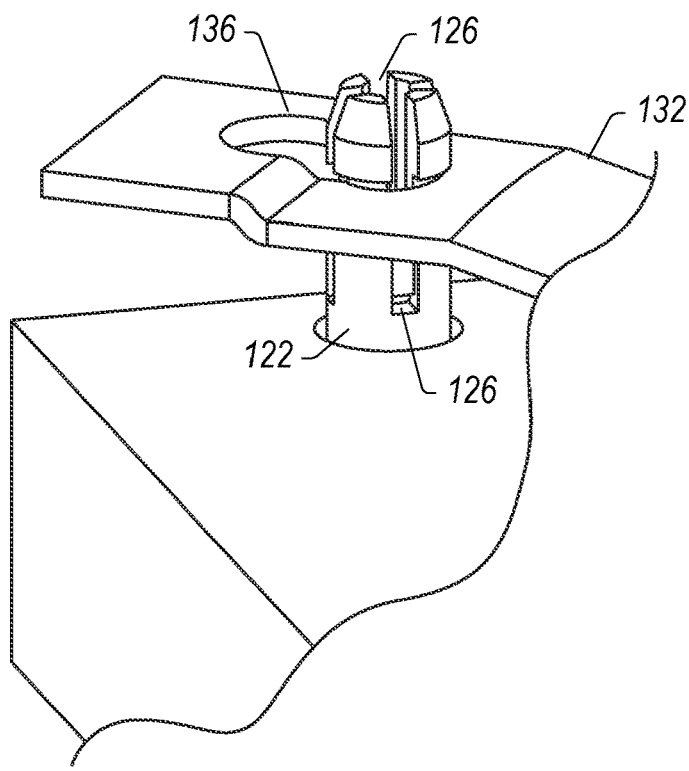
FIG. 10 depicts a perspective view of an embodiment of a leg engaged with a post in the locked position.

FIG. 10 depicts a perspective view of an embodiment of leg 132 engaged with post 122 in the locked position. In various embodiments, as shown in FIG. 10, post 122 includes cross-cuts 126. Cross-cuts 126 allow the outer edges of post 122 to be pressed inwards as the post moves from first portion 136A of slot 136 to second portion 136B (the locked position).

Figure 11:
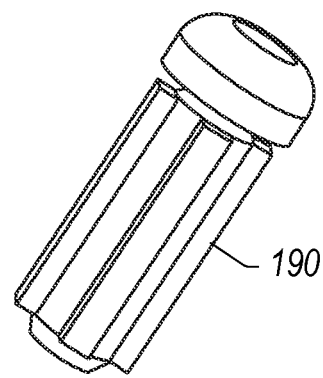
FIG. 11 depicts a perspective view of an embodiment of a slot cap.
Figure 12:
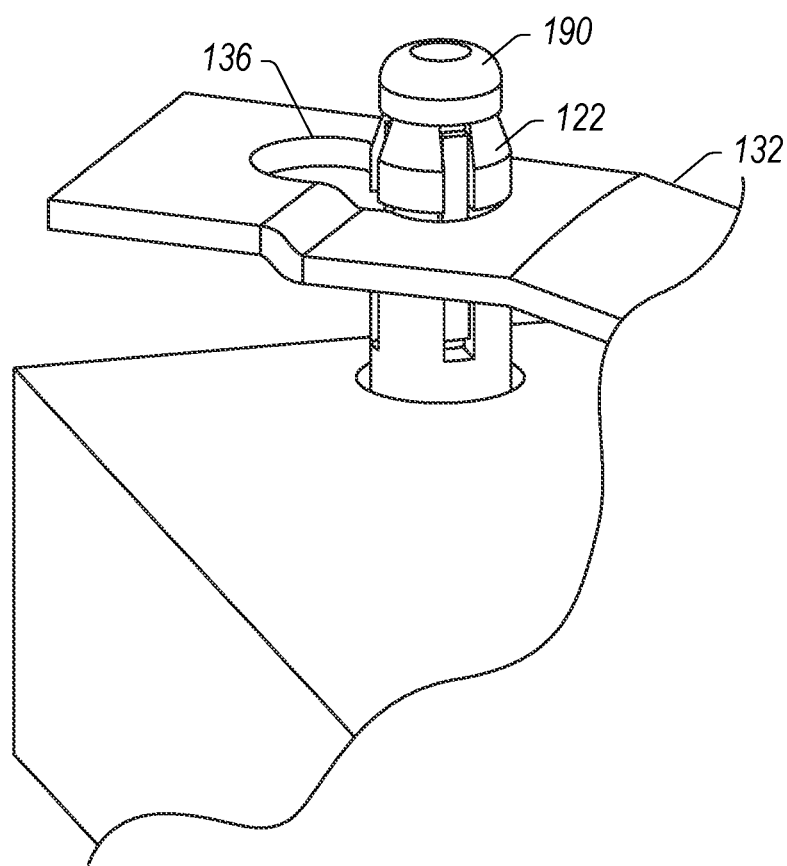
FIG. 12 depicts an exploded view representation of an embodiment of a slot cap inserted in a post.

In various embodiments, a cap or other device can be used to secure posts 122 in the locked position and prevent the posts from sliding in slots 136 and disengaging from legs 132. FIG. 11 depicts a perspective view of an embodiment of a slot cap 190. Slot cap 190 may be designed to fit into cross-cuts 126 in posts 122. FIG. 12 depicts an exploded view representation of an embodiment of slot cap 1200 inserted in post 122 to secure the post in slot 136. Slot cap 190 may be removed to allow bracket 130' to be uninstalled from posts 122.

Figure 13:
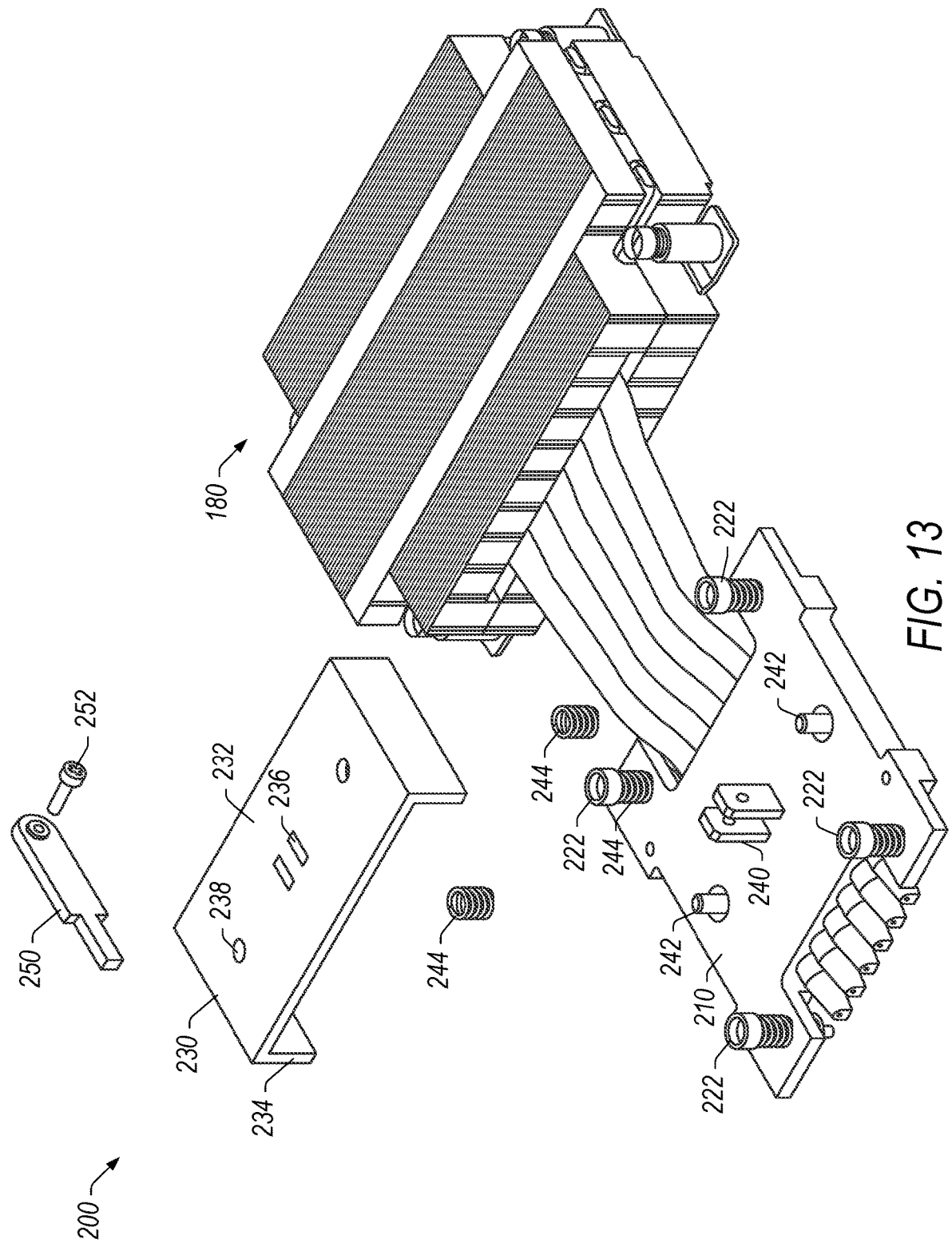
FIG. 13 depicts an exploded perspective view of an embodiment of a mounting system.

FIGS. 13-17 depict various view of another embodiment of a mounting system. FIG. 13 depicts an exploded perspective view of an embodiment of mounting system 200. In the illustrated embodiment, mounting system 200 includes upper plate 210 and bracket 230. Mounting system 200 includes posts 222 extending above an upper surface of the upper plate. In various embodiments, posts 222 are posts extending from a lower plate or attached to a lower plate, as described herein. The lower plate is not depicted in FIGS. 13-17 for simplicity in the drawings. In one embodiment, posts 222 are screws extending through upper plate 210. Posts 222 may be positioned in the corners or along edges of upper plate 210, as described herein. In certain embodiments, upper plate 210 includes attachment post 240 extending upwards from a central portion of the upper plate and posts 242 positioned on opposing sides of the attachment post. In various embodiments, springs 244 are coupled to posts 222 and posts 242.

Bracket 230 may be, for example, a clip shaped member with central portion 232 and legs 234. Bracket 230 also includes openings 236 that allow attachment post 240 to protrude through the bracket and openings 238 that allow posts 242 to protrude through the bracket. Mounting system 200 further includes handle 250 and handle attachment fastener 252.

Figure 14:
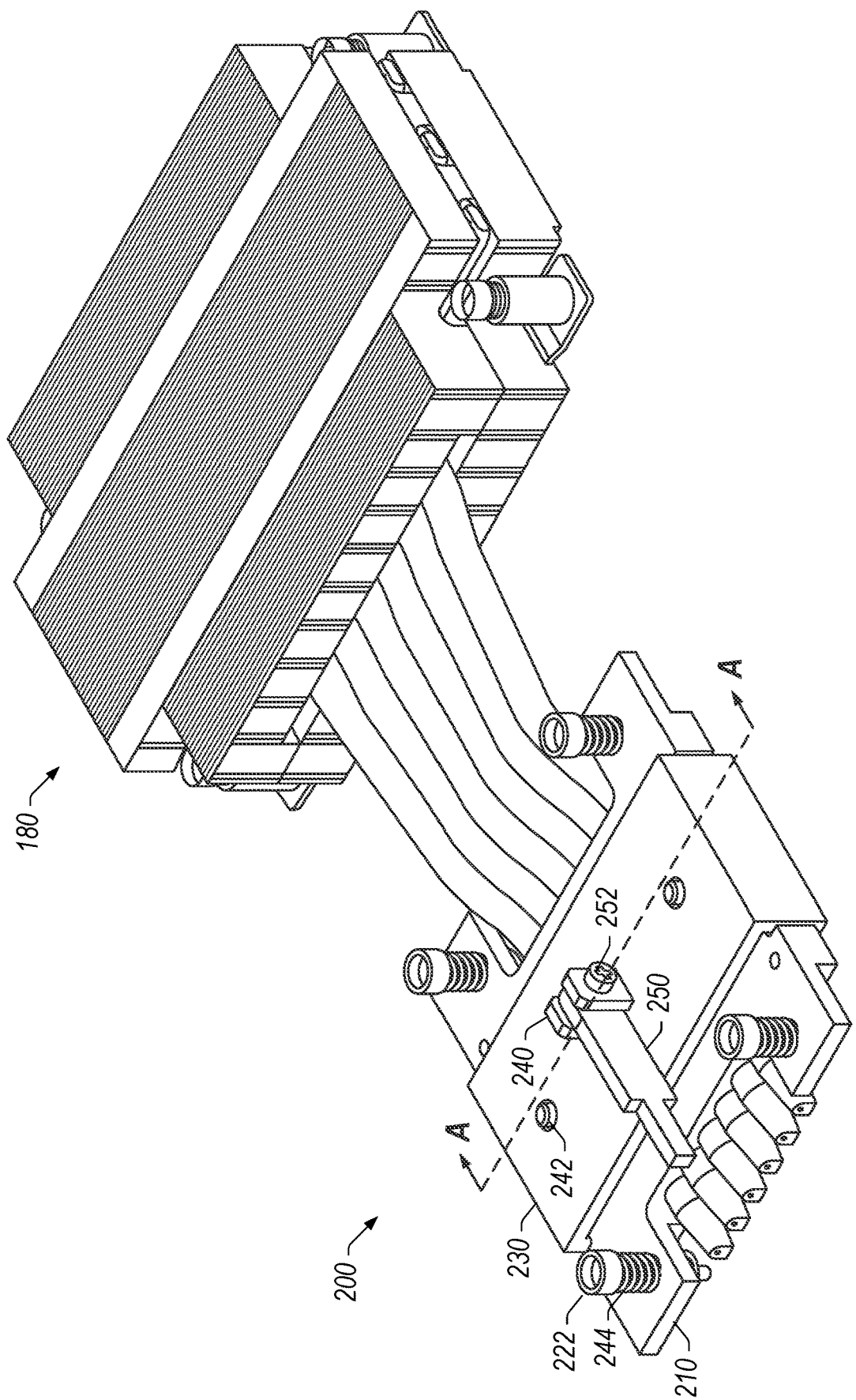
FIG. 14 depicts a perspective view of an assembled embodiment of a mounting system.

FIG. 14 depicts a perspective view of an assembled embodiment of mounting system 200. In the assembled embodiment, a processor (e.g., a bare die processor)(not shown) may be positioned under upper plate 210. As described above, some embodiments are contemplated where a lower plate (not shown) is implemented in mounting system 200 with posts 222 attached to the lower plate and the processor positioned between the upper and lower plates. Other embodiments may be contemplated, however, where upper plate 210 is implemented without a lower plate with the processor positioned underneath the upper plate.

Figure 15:
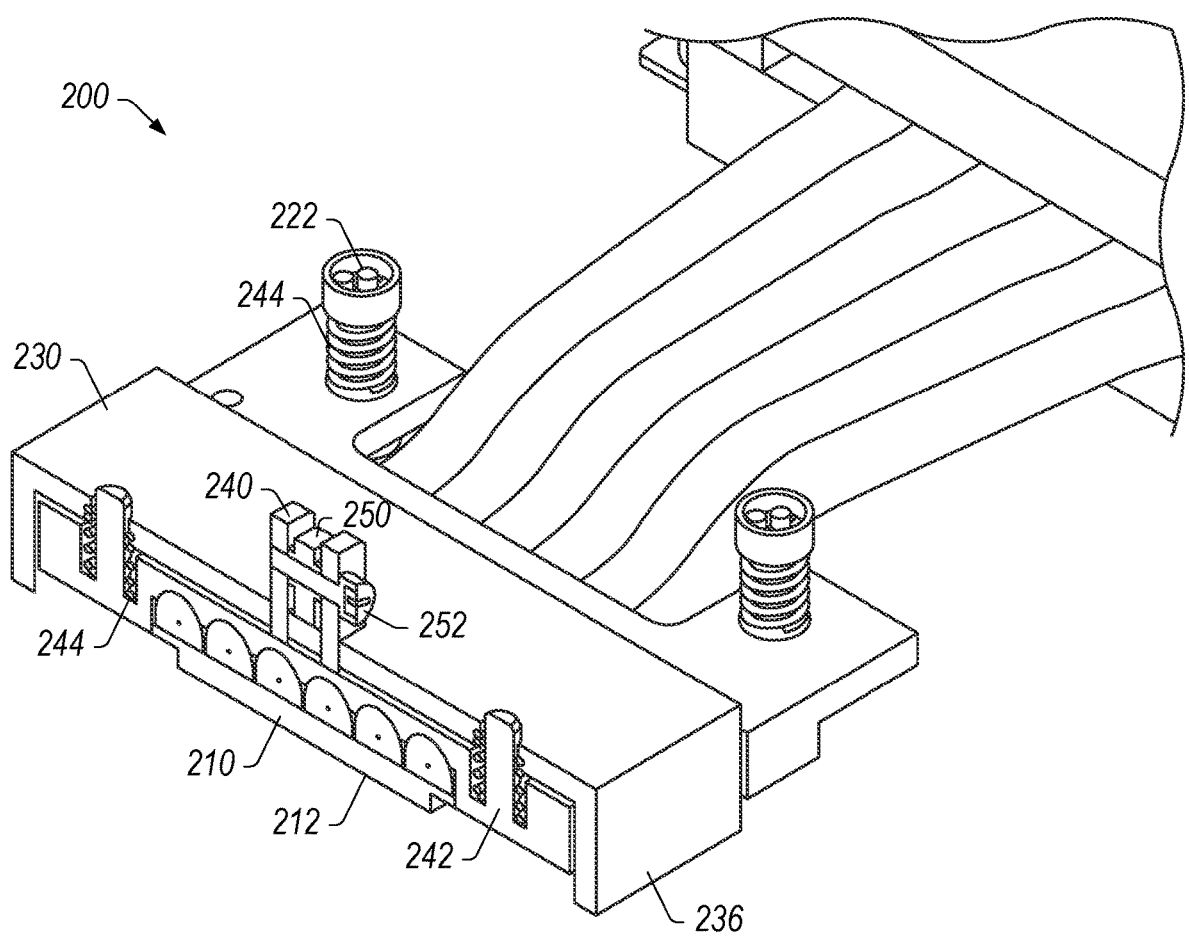
FIG. 15 depicts a cross-section perspective view of the assembled embodiment of FIG. 14 along section line A-A.

FIG. 15 depicts a cross-section perspective view of the assembled embodiment of FIG. 14 along section line A-A. In the illustrated embodiment, bracket 230 is shown pressing down on springs 244 around posts 242 with legs 236 extended below lower surface 212 of upper plate 210. As show in the illustrated embodiment of FIGS. 14 and 15, handle 250 is secured to attachment post 240 with fastener 252 when mounting system 200 is assembled.

Turning back to FIG. 14, handle 250 is shown in a first, unlocked position. Handle 250 may be, for example, an eccentric handle or cam lever in which the handle is mounted eccentrically to attachment post 240 by fastener 252. Accordingly, rotation of handle 250 may transform to downward motion on upper plate 210. In certain embodiments, the downward motion on upper plate 210 by handle 250 is applied as a level force onto the upper plate. For instance, the force applied by handle 250 is applied evenly (e.g., centralized and balanced) across upper plate 210 to inhibit damage to the underlying processor(s) similar to the forces applied by bracket 130, described above. While an eccentric handle is depicted and described herein, embodiments of other mechanisms may be contemplated where a mechanism is capable of applying the level force onto upper plate 210 initiated by a movement of the mechanism. For instance, a handle operating a rack and pinion gear system could be implemented to provide the level force onto upper plate 210.

Figure 16:
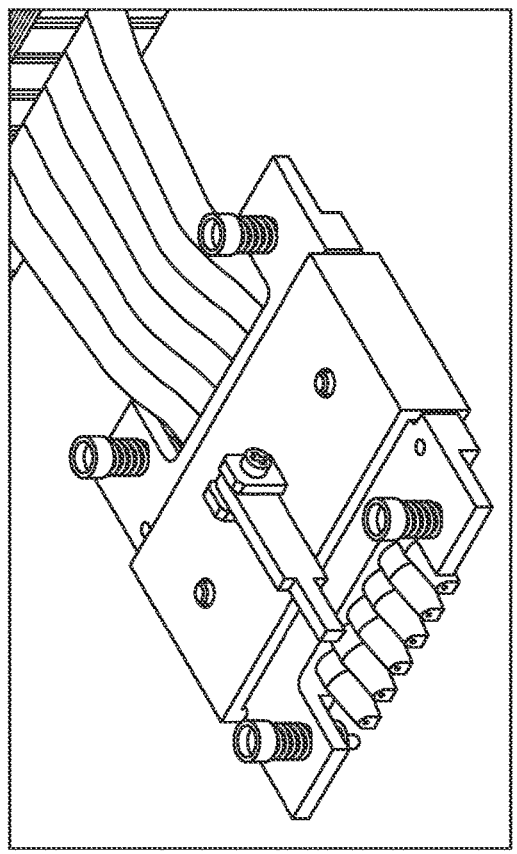
FIG. 16 depicts a cross-sectional side view representation of a mounting system with a handle in the first, unlocked position.
Figure 16:
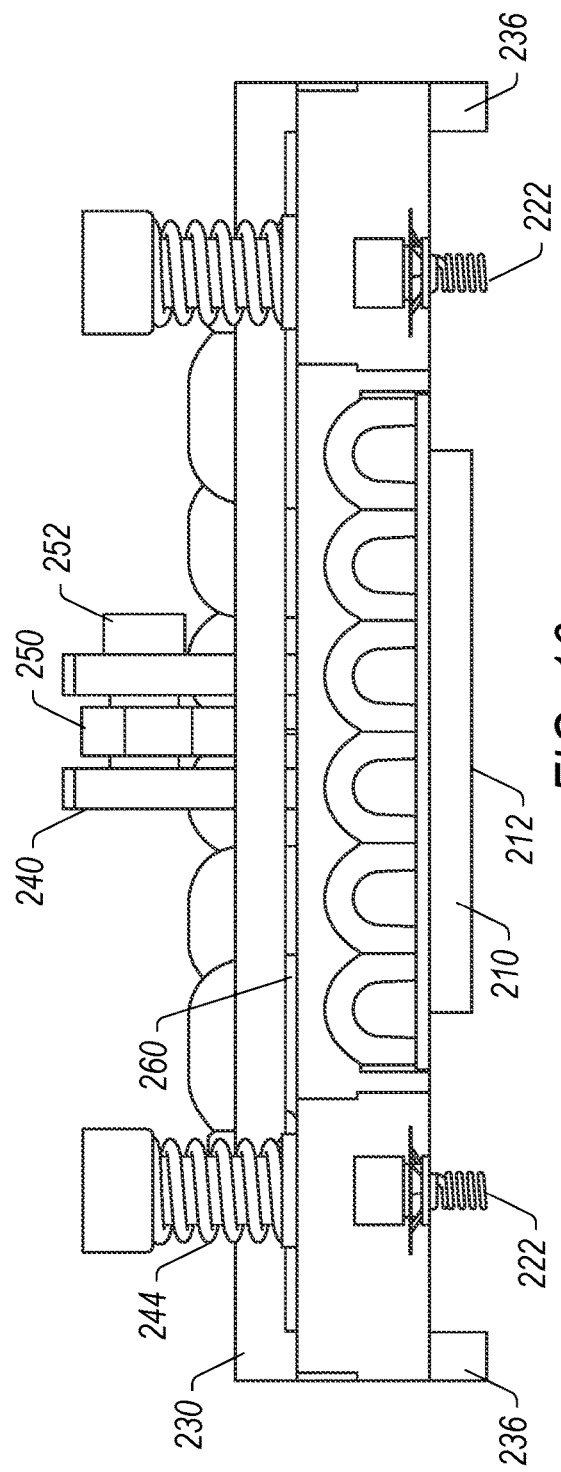

FIG. 16 depicts a cross-sectional side view representation of mounting system 200 with handle 250 in the first, unlocked position (as shown in the inset of FIG. 16). In the first position, there is a small gap 260 between the lower surface of bracket 230 and the upper surface of upper plate 210. Additionally, legs 236 of bracket 230 extend down below lower surface 212 of upper plate 210. Legs 236 are also at about the same height as the lower ends of posts 222, which are configured to contact a processor. Thus, there is no contact between lower surface 212 of upper plate 210 and the processor in the first position.

Figure 17:
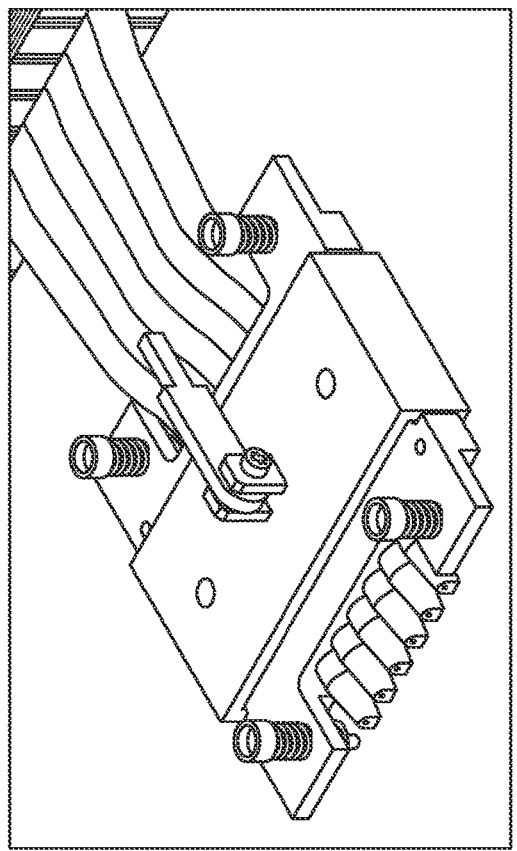
FIG. 17 depicts a cross-sectional side view representation of a mounting system with a handle in the second, locked position.
Figure 17:
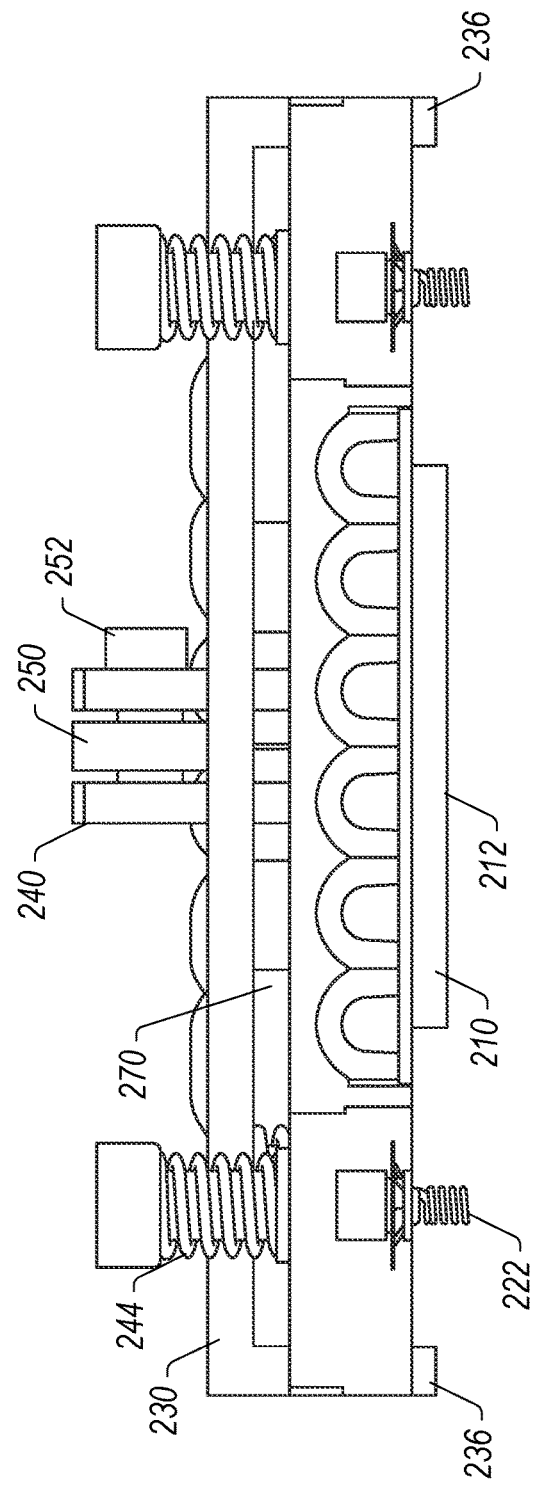

Rotation of handle 250 (e.g., 180° rotation of the handle) moves the handle, and mounting system 200, from the first position to a second, locked position. FIG. 17 depicts a cross-sectional side view representation of mounting system 200 with handle 250 in the second, locked position (as shown in the inset of FIG. 17). The rotation of handle 250 pushes downward on upper plate due to the spring force of springs 244 on posts 242. The downward force changes the gap between the lower surface of bracket 230 and the upper surface of upper plate 210 to a larger gap—gap 270. The increase in the gap causes legs 236 to move above the lower ends of posts 222, allowing the posts to contact the processor and contact between upper plate 210 and the processor.

Mounting system 200, shown in FIGS. 13-17, provides a balanced and centralized downward force when the mounting system is secured to a processor. For instance, the movement of handle 250 from the first position to the second position and the balance of the springs prevents tilting of upper plate 210 as the upper plate contacts the processor. The balancing and centralization of the downward forces helps inhibit tilting of the upper plate and reduces the risk of cracking or damaging the processor while securing the upper plate (e.g., heat sink) to the processor.

In certain embodiments, mounting system 200 is implemented by first fastening upper plate 210 to a lower plate using posts 222 (e.g., posts 222 are screws that are screwed down into the lower plate). Handle 250 is then moved from the first position to the second position to secure upper plate 210 with evenly distributed forces across the upper plate. As first operating handle 250 and then fastening upper plate 210 to the lower plate would likely neutralize the benefits of using the handle to apply the forces to the upper plate, in some embodiments, a mechanism may be implemented to prevent a user from operating the handle before fastening the upper plate to the lower plate. For example, in one contemplated embodiment, a moveable device (such as a thin sheet of material) may be positioned near the holes on upper plate 210 associated with posts 222. In the first position for handle 250, the moveable device allows access to the holes on upper plate 210 associated with posts 222 to allow a user to insert the posts through the holes. In the second position for handle 250, however, the moveable device prevents access to the holes on upper plate 210 associated with posts 222. Thus, if a user attempts to move handle 250 before inserting posts 222 through upper plate 210, the holes will be blocked and the user must return the handle to the first position in order to insert the posts.

In various embodiments, the mounting systems disclosed herein are implemented with multiple bare die processors in a single package (e.g., an MCP). As described above, the multiple bare die processors may have varying heights as the processors are of various types. Accordingly, in embodiments with multiple bare die processors, the upper plate (e.g., upper plate 110 or upper plate 210) may have a stepped bottom that has multiple surfaces of different heights to accommodate the varying processor heights.

Figure 18:
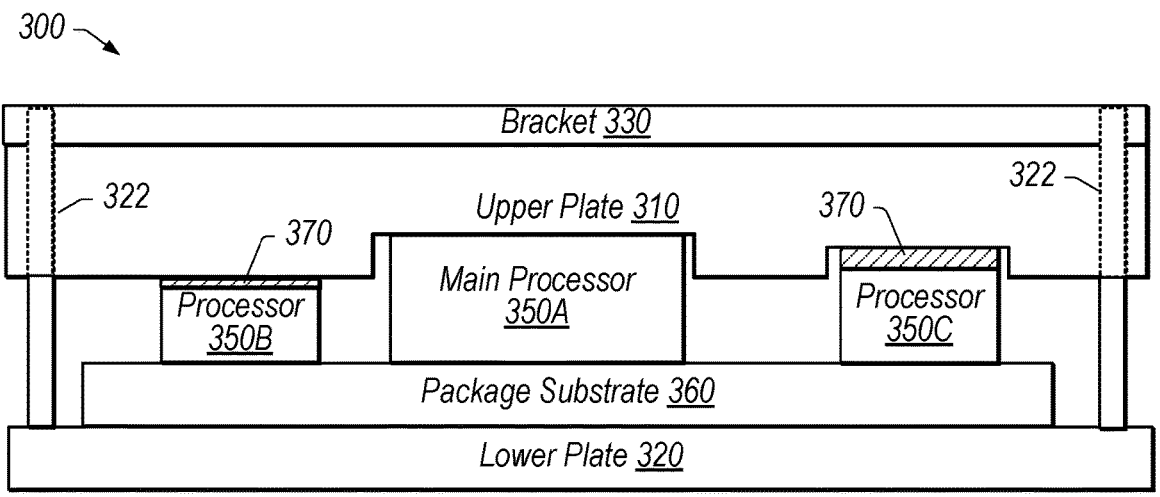
FIG. 18 depicts a side-view schematic representation of an embodiment of a mounting system implemented with multiple bare die processors.

FIG. 18 depicts a side-view schematic representation of an embodiment of a mounting system implemented with multiple bare die processors. In the illustrated embodiment, mounting system 300 includes upper plate 310, lower plate 320, bracket 330, posts 322, and processors 350 positioned on package substrate 360. Main processor 350A and processors 350B, 350C on package substrate 360 may be part of a bare die MCP. Typically, main processor 350A has a greatest height above package substrate 360 but other embodiments may be contemplated where other dies have larger heights above the package substrate. Additional embodiments may also be contemplated without lower plate 320, as described herein.

In the illustrated embodiment, the bottom (e.g., base) of upper plate 310 has stepped surfaces that accommodate the varying heights of processors 350. In certain embodiments, the stepped surfaces are configured such that only one of the stepped surfaces contacts one of the processors 350. For example, in the depicted embodiment, only the surface associated with main processor 350A is in contact with a processor. Having only one surface in contact with one processor (e.g., the main processor 350A) may reduce the risk of providing the processors with uneven loads when upper plate 310 is secured onto the processors.

In various embodiments, the gap between other processors (e.g., processor 350B and processor 350C) and the other stepped surfaces is filled with material 370. In certain embodiments, material 370 is a thermally conductive material. In some embodiments, material 370 is a compressible, thermally conductive material. Using compressing material for material 370 allows upper plate 310 to be pressed downwards onto processor 350B and processor 350C without damaging the processors. Material 370 may be, for example, a thermal interface material (TIM) such as thermal grease, thermal gel, thermal putty, or thermal paste. Accordingly, compressible material 370 provides at least some heat conductance between the other processors and upper plate 310. In some embodiments, a thermally conductive material is also positioned between main processor 350A and upper plate 310. For instance, a thermal grease may be positioned between main processor 350A and upper plate 310. The thermally conductive material positioned between main processor 350A and upper plate 310 may be compressible or incompressible material.

Figure 19:
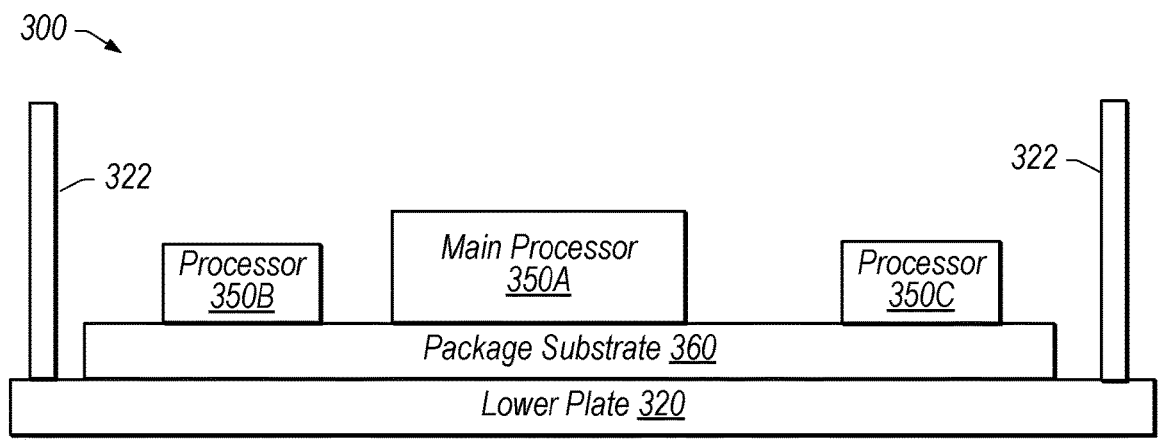
FIGS. 19-20 schematically depict various steps in the installation of a mounting system.
Figure 20:
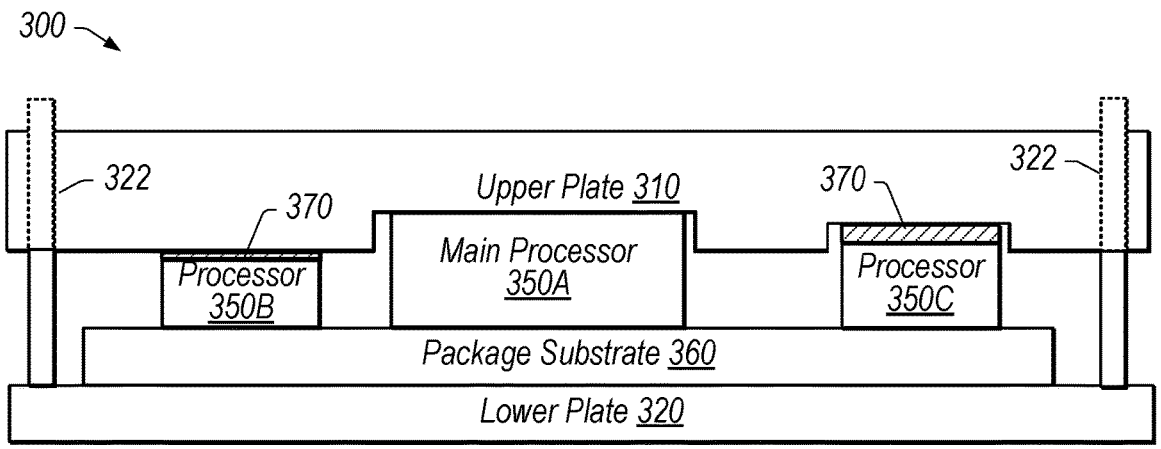

FIGS. 19-20 schematically depict various steps in the installation of a mounting system disclosed herein. In FIG. 19, an MCP with multiple processors 350 positioned on package substrate 360 is positioned on lower plate 320. In FIG. 20, upper plate 320 is positioned over processors 350 and lower plate 320 with the upper plate having posts 322 protruding above the upper surface of the upper plate. Turning back to FIG. 18, bracket 330 is installed and secured to upper plate 310 and/or lower plate 320 to secure mounting system 300 to processors 350.

As described herein, embodiments without the use of a lower plate may also be contemplated. In such embodiments, the steps in the installation of a mounting system may begin with the schematic in FIG. 20 without the lower plate being positioned. Posts 322 may still protrude above upper plate 310 with the posts being attached or otherwise fastened to the upper plate, as described herein.

The various methods as illustrated in the figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A processor mounting system, comprising:
a bare die processor; and
a mounting structure for the bare die processor, the mounting structure comprising:
an upper plate comprising:
a lower surface configured to be positioned proximate an upper surface of the bare die processor; and
a heat transfer portion configured to transfer heat conducted to the upper plate from the bare die processor to a cooling fluid in fluid communication with the heat transfer portion;
a lower plate positioned on an opposite side of the bare die processor from the upper plate, wherein the lower plate includes a plurality of posts positioned along edges of the lower plate, wherein the plurality of posts include protruding portions from an upper surface of the upper plate when assembled in the mounting structure, the protruding portions having notches; and
a bracket configured to be positioned on the upper surface of the upper plate, wherein:
the bracket includes a central portion and legs extending towards the protruding portions of the plurality of posts when coupled to the upper surface of the upper plate,
the bracket is configured to engage with the upper surface of the upper plate at the central portion,
end portions of the legs are configured to simultaneously engage with the plurality of posts,
slots in the end portions of the legs are configured to simultaneously engage with notches in the plurality of posts as the legs are pushed downwards such that the legs and the central portion of the bracket provide a balanced downward force on the upper plate, and
the slots are stepped between a first position and a second position, wherein, in the first position, the slots are able to fit over the plurality of posts, and wherein, in the second position, the slots engage with the notches.

2. The processor mounting system of claim 1, wherein moving the bracket to the installed position includes pushing downwards on the legs, wherein the end portions of the legs include the slots in an interior of the end portions, and wherein the slots are configured to engage with the notches in the plurality of posts as the legs are pushed downwards towards the upper surface of the upper plate.

3. The processor mounting system of claim 1, wherein the bare die processor comprises multiple bare die processors with varying heights, and wherein the lower surface of the upper plate includes multiple surfaces with stepped heights to accommodate the varying heights of the multiple bare die processors.

4. The processor mounting system of claim 3, wherein the stepped heights are configured such at only one of the multiple surfaces is positioned proximate an upper surface of a main bare die processor of the multiple bare die processors, and wherein a thermally conductive material is placed in gaps between the multiple surfaces and the multiple bare die processors.

5. The processor mounting system of claim 1, further comprising:
a heat sink thermally connected to the heat transfer portion of the upper plate via one or more cooling tubes.

6. The processor mounting system of claim 1, wherein the balanced downward force is generated by rotation of a screw.

7. A mounting system, comprising:
an upper plate comprising:
a lower surface configured to be positioned proximate an upper surface of a processor; and
a heat transfer portion configured to transfer heat conducted to the upper plate from the processor to a cooling fluid in fluid communication with the heat transfer portion;
a plurality of posts having protruding portions from along edges of an upper surface of the upper plate when assembled in the mounting structure;
a bracket configured to be positioned on the upper surface of the upper plate, wherein the bracket includes a central portion configured to engage with the upper surface of the upper plate such that the bracket provides a centralized downward force on the upper plate in an installed position; and
a lower plate configured to be positioned on an opposite side of the processor from the upper plate, wherein the lower plate includes the plurality of posts, wherein the bracket includes legs extending towards the protruding portions of the plurality of posts when coupled to the upper surface of the upper plate, and wherein slots in end portions of the legs are configured to simultaneously engage with notches in the plurality of posts as the legs are pushed downwards such that the legs and the central portion of the bracket provide the centralized downward force on the upper plate, and wherein the slots are stepped between a first position and a second position, wherein, in the first position, the slots are able to fit over the plurality of posts, and wherein, in the second position, the slots engage with the notches.

8. The mounting system of claim 7, wherein the upper plate is configured to be positioned on upper surfaces of multiple processors with varying heights, wherein a bottom of the upper plate comprises multiple surfaces, wherein the multiple surfaces includes a single surface configured to be positioned proximate an upper surface of a main processor, and wherein a thermally conductive material is configured to be placed in gaps between the multiple surfaces and the multiple processors.

9. The mounting system of claim 7, wherein the centralized downward force is generated by rotation of a screw.

10. A method, comprising:
positioning an upper plate on a processor, wherein the upper plate comprises:
a lower surface configured to be positioned proximate an upper surface of the processor; and
a heat transfer portion configured to transfer heat conducted to the upper plate from the processor to a cooling fluid in fluid communication with the heat transfer portion;
wherein a plurality of posts include protruding portions from an upper surface of the upper plate along edges of the upper plate, and wherein a lower plate includes the plurality of posts;
positioning a bracket on the upper surface of the upper plate, wherein the bracket includes a central portion that engages with the upper surface of the upper plate and includes legs extending towards the protruding portions of the plurality of posts when engaged with the upper surface of the upper plate, and wherein slots in end portions of the legs are configured to simultaneously engage with notches in the plurality of posts as the legs are pushed downwards such that the legs and the central portion of the bracket provide the centralized downward force on the upper plate, and wherein the slots are stepped between a first position and a second position, wherein, in the first position, the slots are able to fit over the plurality of posts, and wherein, in the second position, the slots engage with the notches; and securing the bracket to the upper surface of the upper plate, wherein a centralized downward force is provided on the upper plate as the bracket is secured to the upper plate, and wherein securing the bracket to the upper surface of the upper plate includes securing the bracket to one or more of the plurality of posts.

11. The method of claim 10, wherein the bracket includes the legs with the end portions that engage the plurality of posts as the bracket is secured to the upper plate.

12. The method of claim 10, wherein the lower surface of the upper plate is configured to be positioned proximate an upper surface of a plurality of processors, wherein the plurality of processors includes multiple bare die processors with varying heights, and wherein the lower surface of the upper plate includes multiple surfaces with stepped heights to accommodate the varying heights of the processors.

13. The method of claim 10, wherein the centralized downward force is generated by rotation of a screw.

* * * * *